United States Patent
Hack et al.

(10) Patent No.: US 10,964,757 B2
(45) Date of Patent: Mar. 30, 2021

(54) ENERGY EFFICIENT OLED TV

(71) Applicant: Universal Display Corporation, Ewing, NJ (US)

(72) Inventors: Michael Hack, Carmel, CA (US); Michael Stuart Weaver, Princeton, NJ (US); Nicholas J. Thompson, New Hope, PA (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 16/925,587

(22) Filed: Jul. 10, 2020

(65) Prior Publication Data

US 2020/0343316 A1  Oct. 29, 2020

Related U.S. Application Data

(63) Continuation of application No. 16/515,171, filed on Jul. 18, 2019, now Pat. No. 10,797,112.

(Continued)

(51) Int. Cl.
 *H01L 29/08* (2006.01)
 *H01L 27/32* (2006.01)
(Continued)

(52) U.S. Cl.
 CPC ........ *H01L 27/3211* (2013.01); *H01L 51/502* (2013.01); *H01L 51/5262* (2013.01)

(58) Field of Classification Search
 CPC ............ H01L 27/3211; H01L 27/3206; H01L 51/502; H01L 51/5012; H01L 51/5262
 See application file for complete search history.

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| CN | 1689064 A | 10/2005 |
| CN | 101874317 A | 10/2010 |

(Continued)

OTHER PUBLICATIONS

International Search Report and Written Opinion dated Nov. 10, 2015 in corresponding International Application No. PCT/US2015/032672, Nov. 10, 2015.

(Continued)

*Primary Examiner* — Phuc T Dang
(74) *Attorney, Agent, or Firm* — Butzel Long

(57) ABSTRACT

Embodiments of the disclosed subject matter provide a full-color pixel arrangement for a device, the full-color pixel arrangement including a plurality of sub-pixels, each having an emissive region of a first color, where the full-color pixel arrangement comprises emissive regions having exactly one emissive color that is a red-shifted color of a deep blue sub-pixel of the plurality of sub-pixels. Embodiments of the disclosed subject matter may also provide a full-color pixel arrangement for a device, the full-color pixel arrangement including a plurality of sub-pixels, each having an emissive region of a first color, where the full-color pixel arrangement comprises emissive regions having exactly one emissive color, and where the plurality of sub-pixels comprise a light blue sub-pixel, a deep blue sub-pixel, a red sub-pixel, and a green sub-pixel.

25 Claims, 6 Drawing Sheets

Related U.S. Application Data

(60) Provisional application No. 62/702,932, filed on Jul. 25, 2018.

(51) Int. Cl.
*H01L 51/50* (2006.01)
*H01L 51/52* (2006.01)

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,280,559 B1 | 8/2001 | Terada |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,038,373 B2 | 5/2006 | Arnold |
| 7,279,704 B2 | 10/2007 | Walters |
| 7,431,968 B1 | 10/2008 | Shtein |
| 7,714,500 B2 | 5/2010 | Hirakata |
| 7,968,146 B2 | 6/2011 | Wagner |
| 7,982,385 B2 | 7/2011 | Kimura |
| 8,040,052 B2 | 10/2011 | Kobayashi |
| 8,084,940 B2 | 12/2011 | Kim |
| 8,159,426 B2 | 4/2012 | Chang |
| 8,400,018 B2 | 3/2013 | Joannopoulos |
| 8,502,445 B2 | 8/2013 | Levermore |
| 8,766,531 B1 | 7/2014 | Hack |
| 8,896,200 B2 | 11/2014 | Huang |
| 10,692,417 B2 | 6/2020 | Lee |
| 2003/0160915 A1 | 8/2003 | Liu |
| 2003/0178936 A1 | 9/2003 | Park |
| 2003/0230980 A1 | 12/2003 | Forrest |
| 2004/0061107 A1 | 4/2004 | Duggal |
| 2004/0080479 A1* | 4/2004 | Credelle ............ G09G 3/3607 345/88 |
| 2004/0174116 A1 | 9/2004 | Lu |
| 2005/0225232 A1 | 10/2005 | Boroson |
| 2005/0242717 A1 | 11/2005 | Bae |
| 2006/0044226 A1 | 3/2006 | Liedenbaum |
| 2006/0082574 A1* | 4/2006 | Tsubaki ............... H04N 13/305 345/419 |
| 2006/0238118 A1 | 10/2006 | Spindler |
| 2006/0238120 A1 | 10/2006 | Miller |
| 2007/0052354 A1 | 3/2007 | Chang |
| 2007/0063946 A1 | 3/2007 | Nakamura |
| 2007/0205423 A1 | 9/2007 | Yamazaki |
| 2007/0257944 A1 | 11/2007 | Miller |
| 2007/0273295 A1 | 11/2007 | Wakabayashi |
| 2007/0279372 A1 | 12/2007 | Brown Elliott |
| 2008/0198180 A1 | 8/2008 | Langendijk |
| 2008/0203905 A1 | 8/2008 | Je |
| 2009/0051283 A1 | 2/2009 | Cok |
| 2009/0085478 A1 | 4/2009 | Cok |
| 2009/0091238 A1 | 4/2009 | Cok |
| 2009/0092325 A1 | 4/2009 | Brown Elliott |
| 2009/0102352 A1 | 4/2009 | Cok |
| 2009/0109172 A1 | 4/2009 | Lee |
| 2009/0121983 A1 | 5/2009 | Sung |
| 2009/0189881 A1 | 7/2009 | Ooishi |
| 2009/0295283 A1 | 12/2009 | Kim |
| 2010/0053043 A1 | 3/2010 | Sakamoto |
| 2010/0090620 A1 | 4/2010 | Hack |
| 2010/0103187 A1 | 4/2010 | Linssen |
| 2010/0187988 A1 | 7/2010 | Forrest |
| 2010/0219427 A1 | 9/2010 | Fukuda |
| 2010/0231484 A1 | 9/2010 | Cok |
| 2010/0244069 A1 | 9/2010 | Weaver |
| 2011/0062427 A1 | 3/2011 | Jeong |
| 2011/0095276 A1 | 4/2011 | Imai |
| 2011/0096530 A1 | 4/2011 | Shimizu |
| 2011/0248294 A1 | 10/2011 | Weaver |
| 2011/0309389 A1 | 12/2011 | Yu |
| 2012/0001207 A1 | 1/2012 | Lee |
| 2012/0026210 A1 | 2/2012 | Yano |
| 2012/0075278 A1 | 3/2012 | Hara |
| 2012/0147065 A1 | 6/2012 | Byun |
| 2012/0287605 A1 | 11/2012 | Chen |
| 2012/0313843 A1 | 12/2012 | Kondoh |
| 2013/0020933 A1 | 1/2013 | Levermore |
| 2013/0082589 A1 | 4/2013 | So |
| 2013/0105777 A1 | 5/2013 | Adamovich |
| 2013/0105778 A1 | 5/2013 | Kim |
| 2013/0105833 A1 | 5/2013 | Weaver |
| 2013/0146853 A1 | 6/2013 | Lee |
| 2013/0146904 A1 | 6/2013 | Edmond |
| 2013/0187132 A1 | 7/2013 | Ando |
| 2013/0235094 A1 | 9/2013 | Cok |
| 2013/0285537 A1 | 10/2013 | Chaji |
| 2013/0337588 A1 | 12/2013 | Lee |
| 2014/0061595 A1 | 3/2014 | Kim |
| 2014/0065750 A1 | 3/2014 | Harikrishna Mohan |
| 2014/0084256 A1 | 3/2014 | Kim |
| 2014/0111406 A1 | 4/2014 | Wang |
| 2014/0183471 A1 | 7/2014 | Heo |
| 2014/0291647 A1 | 10/2014 | Suzuki |
| 2014/0327709 A1 | 11/2014 | Hack |
| 2015/0009194 A1 | 1/2015 | Kim |
| 2015/0034911 A1 | 2/2015 | Liu |
| 2015/0138463 A1 | 5/2015 | Jinta |
| 2017/0207281 A1 | 7/2017 | Hack |
| 2017/0229663 A1 | 8/2017 | Tsai |

FOREIGN PATENT DOCUMENTS

| | | |
|---|---|---|
| JP | 2007317915 | 12/2007 |
| JP | 2008218300 A | 9/2008 |
| JP | 2008539554 A | 11/2008 |
| JP | 2010050014 A | 3/2010 |
| JP | 2010165510 A | 7/2010 |
| JP | 2010192366 A | 9/2010 |
| JP | 2012077069 A | 4/2012 |
| JP | 2012089513 A | 5/2012 |
| JP | 2012109576 A | 6/2012 |
| JP | 2014045166 | 3/2014 |
| WO | 2006115960 A1 | 11/2006 |
| WO | 2008057394 A1 | 5/2008 |
| WO | 2010011390 A2 | 1/2010 |
| WO | 2014020817 A1 | 2/2014 |

OTHER PUBLICATIONS

Baldo et al.Highly efficient phosphorescent emission from organic electroluminescent devices, Nature, vol. 395, pp. 151-154, 1998.
Office Action dated Apr. 14, 2017 as received in CN Application No. 201410019395.X.
Office Action dated Jul. 11, 2017 as received in JP Application No. 2014-005666.
Office Action dated Feb. 14, 2017 as received in JP Application No. 2014-005666.
Hack, et al., "Novel Two Mask AMOLED Display Architecture", SID 2014 Digest, pp. 567-569.
Notice of Allowance dated Aug. 15, 2016 as received in U.S. Appl. No. 14/243,145.
Wood, "MacAdam Ellipses", Protocol, 2010, 15-18.
Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.
CN Office Action dated Dec. 13, 2017 in Application No. 201410019395.X, 5 pages.
Chinese Office Action dated Jun. 12, 2018 for CN Application No. 201410019395.X, 8 pages.
Chinese Office Action issued in corresponding CN Application No. 201580028268.9, dated Oct. 25, 2018, 5 pages.

(56) References Cited

OTHER PUBLICATIONS

Japanese Office Action (including English translation) issued in corresponding JP Application No. 2016-569684, dated Oct. 30, 2018, 9 pages.
C Hosokawa, M Eida, M Matsuura, K Fukuoka, H Nakamura, T Kusumoto. "Organic Multicolor EL Display with Fine Pixels". Proceedings of the Society for Information Displays International Symposium, 1997, pp. 331-334 and 435-436.
Korean Office Action (with English language translation) for Application No. KR10-2014-0002707, dated Jun. 27, 2019, 15 pages.

* cited by examiner

Light blue  Red

Deep blue  Green

Light blue     Red

Deep blue     Green

ENERGY EFFICIENT OLED TV

CROSS-REFERENCE TO RELATED APPLICATIONS

This application is a continuation of U.S. patent application Ser. No. 16/515,171, filed Jul. 18, 2019, which claims priority to U.S. patent application Ser. No. 62/702,932, filed Jul. 25, 2018, the entire contents of each of which are incorporated herein by reference.

FIELD

The present invention relates to providing a full color display that includes an unpatterned light blue phosposrescent organic light emitting diode (OLED), that includes deep blue sub-pixels enabled by filtering or microcavity design, as well as other colored sub-pixels that may be enabled by filtering, cavity design, or downconversion light blue. The light blue unpatterned OLED may be in a stacked arrangement, and may include phosphorescent and/or fluorescent and/or electroluminescent quantum dot emissive layers.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a full-color pixel arrangement for a device may be provided, the full-color pixel arrangement including a plurality of sub-pixels, each having an emissive region of a first color, where the full-color pixel arrangement comprises emissive regions having exactly one emissive color that is a red-shifted color of a deep blue sub-pixel of the plurality of sub-pixels.

The exactly one emissive color may be light blue having a peak wavelength which may be greater than or equal to 460 nm, greater than or equal to 465 nm, or greater than or equal to 470 nm. The exactly one emissive color may be light blue having 1931 CIE coordinates with CIEy that is greater than or equal to 0.20, greater than or equal to 0.15, or greater than or equal to 0.10. The exactly one emissive color may be formed by a phosphorescent light blue emitter.

The plurality of sub-pixels of the full-color pixel arrangement may include a light blue sub-pixel, the deep blue sub-pixel, a red sub-pixel, and a green sub-pixel. The deep blue sub-pixel may be formed by applying a color change medium to the light-blue sub-pixel, and has a resultant color range of 1931 CIE coordinates with CIE y of less than 0.10. The deep blue sub-pixel may be disposed in a microcavity to blue shift an output of the emissive region. The red light from the red sub-pixel and green light from the green sub-pixel may be generated by down-converting light emitted from the emissive color of the emissive regions by photoemissive quantum dots that are part of the red sub-pixel and the green sub-pixel. At least one of the red sub-pixels and the green sub-pixels uses a color filter to refine a spectrum of at least one of the red light emitted from the red subpixel and the green light emitted from the green sub-pixel. At least one of the light blue sub-pixel and the deep blue sub-pixel may be formed in a cavity structure. At least one of the light blue sub-pixel and the deep blue sub-pixel may be formed using a non-cavity structure. The emissive regions having exactly one emissive color may be a single emissive layer including one emitter, a single emissive layer having a plurality of emitters, or a stacked emissive layer device. Each emissive layer of the stacked emissive layer device may have the same type of emitters, has a combination of types of emitters, or has different types of emitters. The emissive layers in the stacked emissive layer device may include a light blue phosphorescent emitter and a deep blue fluorescent emitter. The emissive layers in the stacked emissive layer device may include a light blue phosphorescent emitter and a green phosphorescent emitter. The pixel arrangement may include a yellow sub-pixel. The full-color pixel arrangement of the device may include a white sub-pixel. The emissive regions having exactly one emissive color may be phosphorescent, and are used to generate light emitted by the white sub-pixel. The deep blue sub-pixel of the pixel arrangement may be shared by a plurality of pixels.

The full-color pixel arrangement may provide a Rec2020 color gamut. The device having the full-color pixel arrangement may be an electroluminescent quantum dot device.

According to an embodiment, a full-color pixel arrangement for a device may be provided, the full-color pixel arrangement may include a plurality of sub-pixels, each having an emissive region of a first color, where the full-color pixel arrangement comprises emissive regions having exactly one emissive color, and where the plurality of sub-pixels comprise a light blue sub-pixel, a deep blue sub-pixel, a red sub-pixel, and a green sub-pixel.

The exactly one emissive color may be light blue having a peak wavelength that may be greater than or equal to 460 nm, greater than or equal to 465 nm, and greater than or equal to 470 nm. The exactly one emissive color may be light blue having 1931 CIE coordinates with CIEy greater than or equal to 0.20, greater than or equal to 0.15, or greater than or equal to 0.10. The exactly one emissive color is formed by a phosphorescent light blue emitter.

The deep blue sub-pixel of the full-color pixel arrangement may be formed by applying a color change medium to the light-blue sub-pixel, and may have a resultant color range of 1931 CIE coordinates with CIE y of less than 0.10. The deep blue sub-pixel may be disposed in a microcavity to blue shift an output of the emissive region.

Red light from the red sub-pixel and green light from the green sub-pixel may be generated by down-converting light emitted from the emissive color of the emissive regions by photoemissive quantum dots that are part of the red sub-pixel and the green sub-pixel. At least one of the red sub-pixels and the green sub-pixels uses a color filter to refine a spectrum of at least one of the red light emitted from the red subpixel and the green light emitted from the green sub-pixel.

At least one of the light blue sub-pixel and the deep blue sub-pixel may be formed in a cavity structure. At least one of the light blue sub-pixel and the deep blue sub-pixel may be formed using a non-cavity structure.

The emissive regions having exactly one emissive color may be a single emissive layer including one emitter, a single emissive layer having a plurality of emitters, or a stacked emissive layer device. Each emissive layer of the stacked emissive layer device may have the same type of emitters, may have a combination of types of emitters, or may have different types of emitters. The emissive layers in the stacked emissive layer device may include a light blue phosphorescent emitter and a deep blue fluorescent emitter. The emissive layers in the stacked emissive layer device include a light blue phosphorescent emitter and a green phosphorescent emitter. The pixel arrangement may include a yellow sub-pixel.

The pixel arrangement may include a white sub-pixel. The emissive regions having exactly one emissive color may be phosphorescent, and may be used to generate light emitted by the white sub-pixel. The deep blue sub-pixel of the pixel arrangement may be shared by a plurality of pixels.

The pixel arrangement may provide a Rec2020 color gamut. The device may be an electroluminescent quantum dot device.

In an embodiment, a full-color pixel arrangement for an organic light emitting diode (OLED) device may be provided, the full-color pixel arrangement including a plurality of sub-pixels, each having an emissive region of a first color, where the full-color pixel arrangement comprises emissive regions having exactly two emissive colors.

The exact two emissive colors may be light blue and deep blue. The emissive regions may be a phosphorescent emissive layer, a fluorescent emissive layer, or a thermally activated delayed fluorescent (TADF) layer.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; "Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
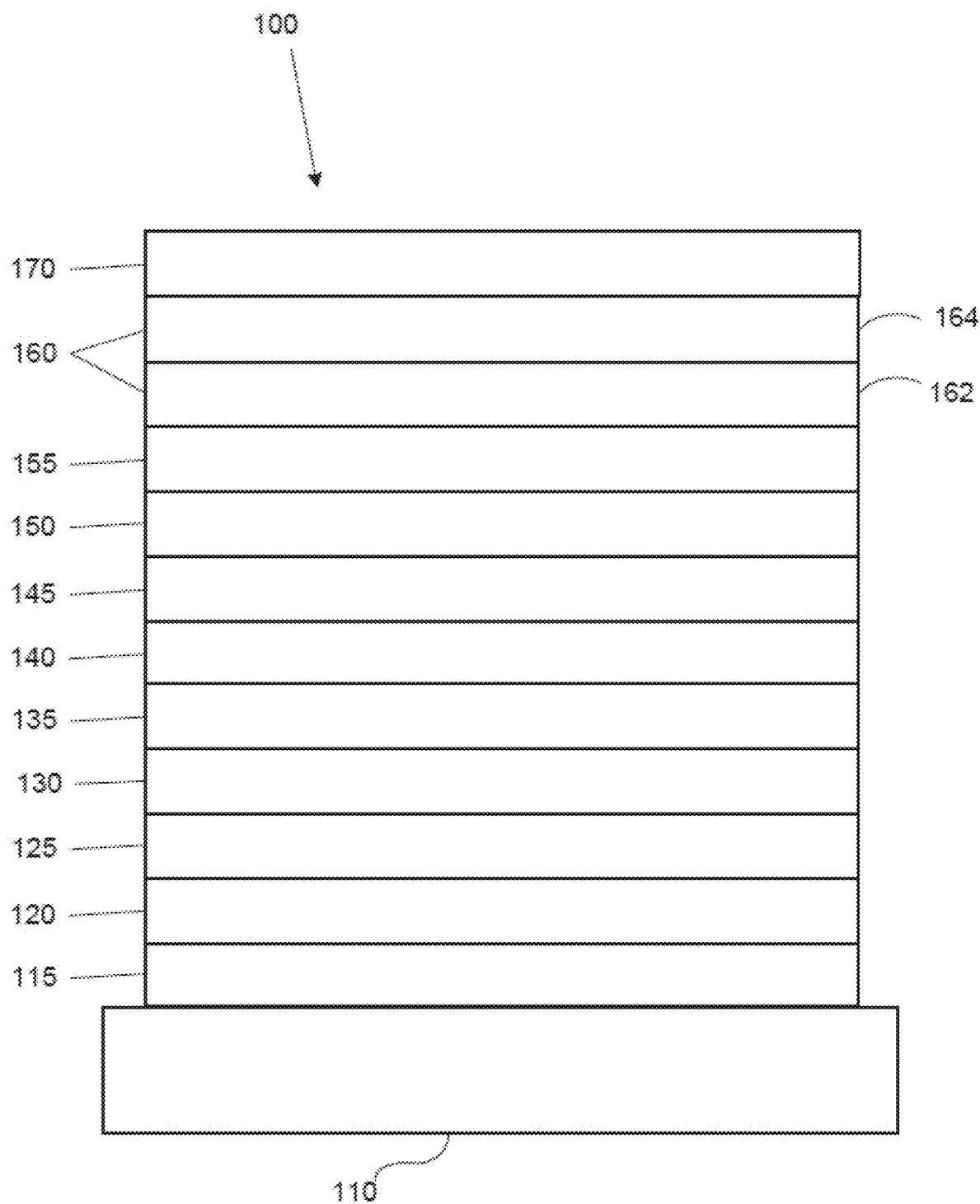
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
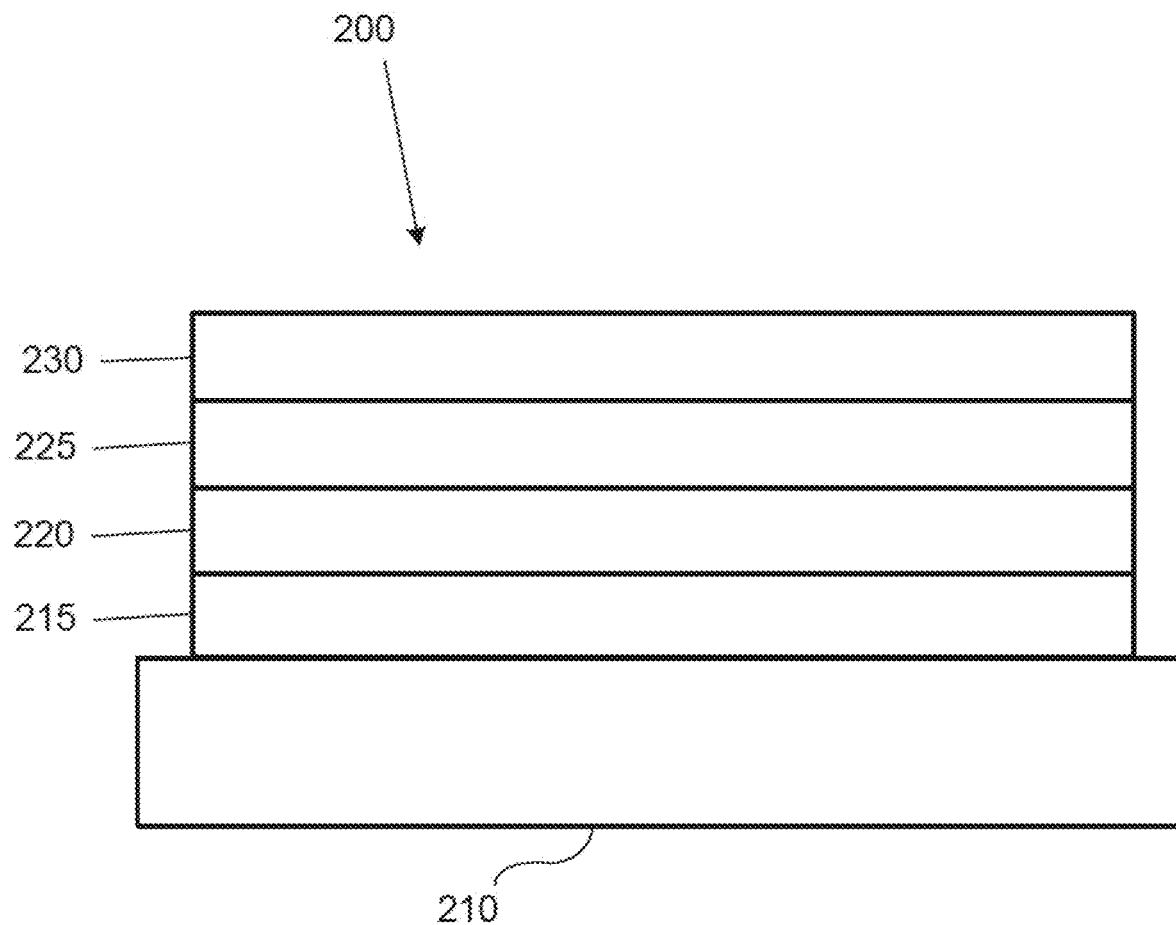
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Emissive layers, such as emissive layer 135 and emissive layer 220 shown in FIGS. 1-2 respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

COMBINATION WITH OTHER MATERIALS

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge generation layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

OLED displays, such as for television, have desirable performance characteristics over other types of displays. It is desirable to continue to improve the performance of OLED displays, and reduce their cost. Some current large area OLED displays use patterning of organic materials at the pixel level to avoid color filters, which makes fabrication from large area substrates more difficult. Some other current large area OLEDs may have reduced performance from not being able to use highly efficient (e.g., phosphorescent) blue sub-pixels.

It is desirable to make OLED TVs without the need for pixel patterning of the OLED films, and to benefit from the high efficiency offered by phosphorescent OLEDs. Current OLED TVs rely on the use of a white unpatterned OLED stack, with color filters used to produce deep blue, green, and red sub-pixels. Others have proposed an approach to make OLED TVs based on an unpatterned deep blue OLED deposition, with quantum dot down-conversion to provide red and green sub-pixels. Although both of these approaches benefit from not having any deposition of the organic material through a fine metal mask (FMM) to render the pixel patterning, both of these approached have low efficiency deep fluorescent blue, as the lifetime of the high efficiency phosphorescent deep blue does not yet meet commercial requirements.

Embodiments of the disclosed subject matter provide a full color OLED display architecture using light blue and deep blue sub-pixels to enable an unpatterned (at the pixel level) highly efficient light blue phosphorescent OLED or TADF (thermally activated delayed fluorescence) OLED to be deposited unpatterned over a large area substrate. Deep blue sub-pixels may be formed by filtering or with a microcavity design from the light blue emissive layer, and red, green, and/or yellow sub-pixels may be provided by patterning quantum dots to downconvert the light blue OLED. That is, embodiments of the disclosed subject matter provide an OLED display architecture that includes a highly efficient light phosphorescent blue as the unpatterned OLED emissive layer, and that includes a B1B2 architecture to provide for deep blue sub-pixels. In the presence of light blue sub-pixels, deep blue sub-pixels may be used for a small fraction of the time, i.e., when a color may not be rendered from the light blue sub-pixel emission. This arrangement reduces the lifetime requirement for the deep blue sub-pixel. Moreover, the unpatterned light blue sub-pixel can take advantage of a high fill-factor, as pixel layout in this arrangement may not have large OLED deposition alignment tolerances between sub-pixels (i.e., preventing one color emitter being placed in an adjacent color sub-pixel). In embodiments of the disclosed subject matter, sub-pixels may be defined by lithography and/or color filter or down conversion medium patterning.

For a deep blue sub-pixel, current light blue phosphorescent emitters may have an onset that begins below 450 nm. Using the B1B2 architecture described throughout, deep blue emission may be used for a small fraction (e.g., less than 5%) of common images, so the photons present in the spectrum tail of light blue emitters from 450-460 nm may be used to generate deep blue sub-pixels. This can be accomplished either by using a color filter to remove longer wavelengths from the light blue emission, or by placing the deep blue sub-pixel in a microcavity to remove the longer wavelengths from the light blue emission.

In some embodiments, a stacked blue unpatterned OLED may be used to provide a sufficient deep blue component. The stacked blue unpatterned OLED may be combined in the same overall stacked or tandem device that includes a deep blue emissive layer. The deep blue emissive layer may be preferably fluorescent, but phosphorescent emitters may be used (e.g., when lifetime is improved), with one or more light blue phosphorescent, fluorescent, or TADF emissive layers.

For red and green sub-pixels, down conversion from light blue to green and red may be accomplished by photoemissive quantum dots. These are generally applied using solution processed deposition techniques either on top of an encapsulated OLED stack, or may be patterned on a cover sheet aligned to a backplane or frontplane of a device. Ink jet printing, stamping, and/or other patterning techniques may be used to form the quantum dot sub-pixels.

Figure 3:
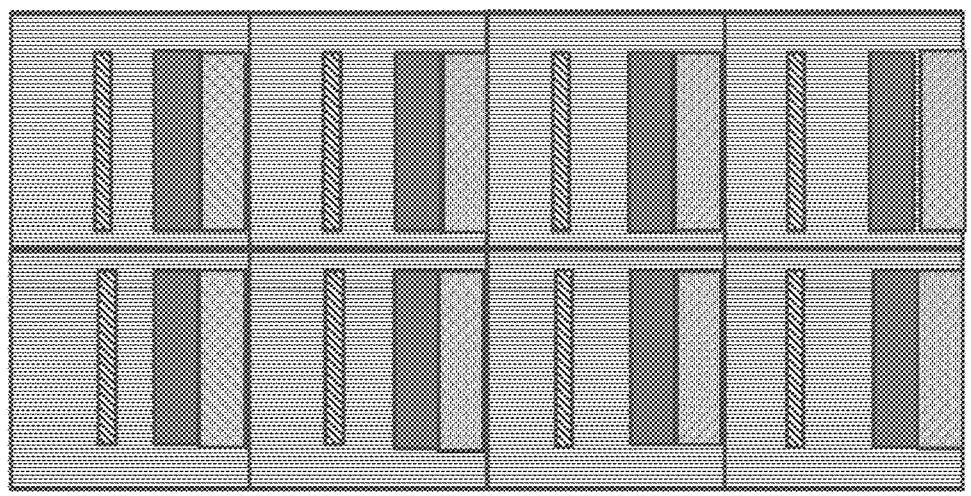
FIG. 3 shows an example of a pixel layout showing an unpatterned light blue OLED that includes deep blue, red, and green sub-pixels that are provided by filtering, cavity design, or downconversion according to embodiments of the disclosed subject matter.
Figure 3:
Figure 3:
Figure 3:
Figure 3:

FIG. 3 shows one embodiment of the disclosed subject matter, where an unpatterned light blue OLED is used as the OLED emissive stack. In particular, FIG. 3 shows a sub-pixel layout for an RGB display with one OLED deposition of light blue emissive material that may enable the RGB1B2 architecture that includes light blue and deep blue sub-pixels. That is, FIG. 3 shows an example of a pixel arrangement having an unpatterned light blue OLED with deep blue, red, and green sub-pixels that may be enabled by filtering, cavity design, or downconversion.

Figure 4:
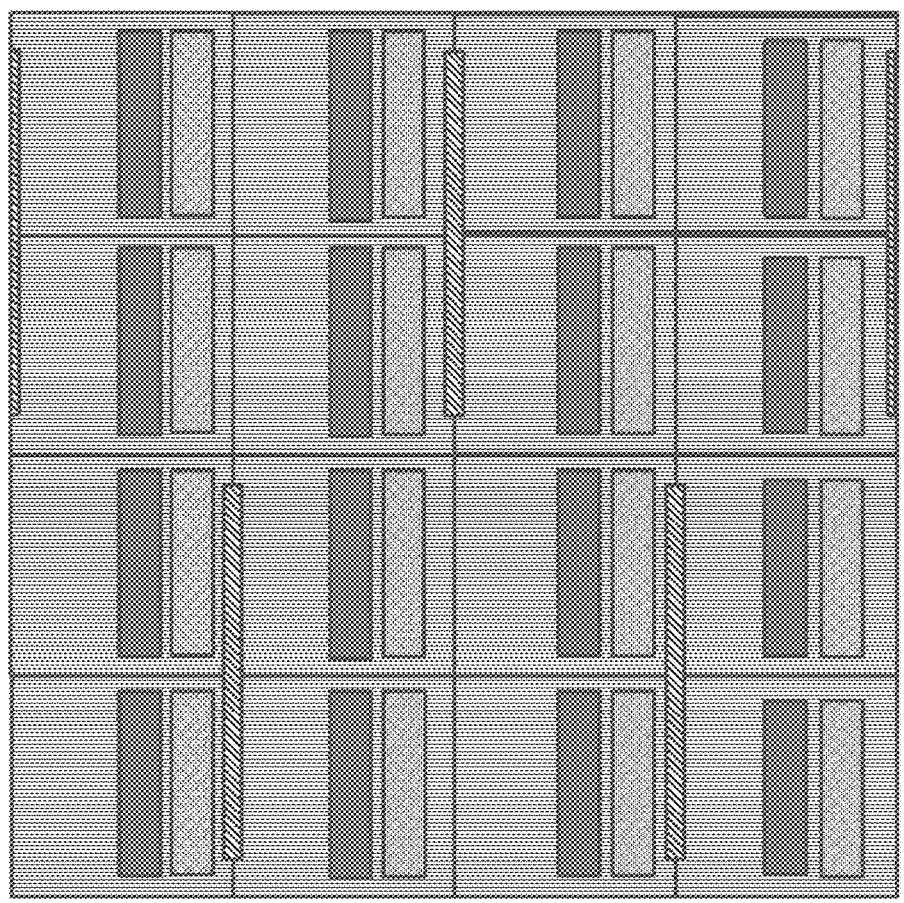
FIG. 4 shows an example of a pixel layout showing an unpatterned light blue OLED with deep blue, red, and green sub-pixels that are provided by filtering, cavity design, or downconversion, where each deep blue sub-pixel is shared by at least one other pixel according to embodiments of the disclosed subject matter.
Figure 4:
Figure 4:
Figure 4:
Figure 4:

Sub-pixel rendering may be used to allow one deep blue sub-pixel to be shared by at least one other pixel. FIG. 4 shows an example of a pixel arrangement having an unpatterned light blue OLED with deep blue, red, and green sub-pixels that may be enabled by filtering, cavity design, or downconversion. That is, FIG. 4 shows a sub-pixel layout for a display using one OLED deposition of light blue that enables the RGB1B2 architecture having light blue and deep blue sub-pixels. Each deep blue sub-pixel may be shared by at least one other pixel. For example, FIG. 4 shows that four pixels share a deep blue sub-pixel. This may improve the fill factor of the deep blue sub-pixels, and may reduce the number of pixel driver circuits and external data driver chips. This arrangement may enable 3.25 sub-pixels per pixel instead of 4 sub-pixels per pixel, as shown in FIG. 3. The display shown in FIG. 4 may have four colors, including red, green, light blue, and deep blue.

Light blue and deep blue sub-pixels may be formed in either structures having a cavity, or non-cavity structures, and they need not be the same. One color of B1 or B2 could use a cavity design while the other color may not use a cavity design. In some embodiments, both B1 and B2 may use a cavity design or, in some other embodiments, both use a non-cavity design.

The OLED emissive layer (EML) may be a single EML device, or a stacked device. Each EML in a stacked device may have the same emitter or combination of emitters, or may use different emitters. For example, one EML in a stacked OLED may be light blue phosphorescent and a second EML may be a deeper blue fluorescent EML to provide a greater deep blue component for the deep blue sub-pixels.

A four sub-pixel display may provide an increased color gamut than a conventional 3 sub-pixel display and may provide an improved path to a Rec2020 color gamut. Photoemissive quantum dots may provide saturated red and green sub-pixels. By using the B1B2 architecture described throughout, the deep blue B2 may be more saturated than can be realized in a single blue sub-pixel display. That is, the single blue deep blue OLED sub-pixel may not be as efficient and have a reduced lifetime compared to the B1B2 architecture.

The B1B2 architecture may be used in conjunction with OLED devices based on different emission principles such as TADF, hyperfluorescence, or phosphor sensitized fluorescence.

To achieve Rec2020 color, a plurality of photons with a peak wavelength of about 640 nm may be used to achieve a saturated red of approximately (0.69, 0.31). The red sub-pixel may be the largest sub-pixel in an arrangement where all sub-pixels have similar lifetime. In embodiments of the disclosed subject matter, sub-pixels may be based on a light blue OLED, independent of the color of the light emitted from that sub-pixel. One way to reduce the usage of the deep red sub-pixel and to extend its lifetime may be to add a yellow sub-pixel to each pixel. In this case, most images around the white point of the CIE chart may be rendered with blue and yellow, and a small amount of deep saturated green and deep saturated red may be used to render colors towards the red and green vertices of the CIE chart. This architecture is shown in FIG. 5.

Figure 5:
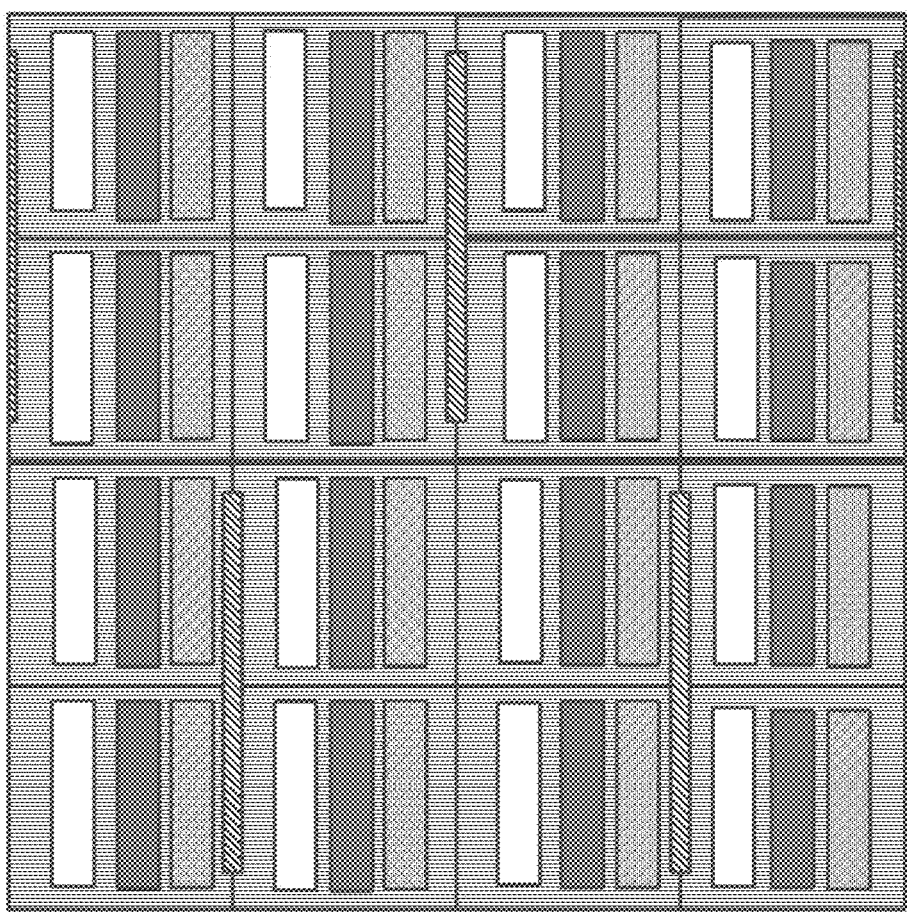
FIG. 5 shows a sub-pixel layout for a RGBY (Red-Green-Blue-Yellow) display using one OLED deposition (e.g., light blue) to provide a RGYB1B2 architecture, where B1 and B2 may be light blue and deep blue sub-pixels according to embodiments of the disclosed subject matter.

FIG. 5 shows a sub-pixel arrangement for RGBY (red, green, blue, yellow) displays using a light blue OLED deposition, and enabling the RGB1B2 architecture according to an embodiment of the disclosed subject matter. As shown in FIG. 5, one dark blue sub-pixel may be used for every four pixels. This is merely an example, and the one dark blue sub-pixel may be shared with at least one other pixel. The arrangement shown in FIG. 5 may reduce the number of TFT circuits and data lines to 4.25 per pixel. A display formed from the arrangement shown in FIG. 5 may have 5 colors, including red, green, yellow, light blue, and deep blue.

In one embodiment, a full color OLED display based on only a light blue unpatterned OLED deposition, where each pixel has at least 4 colors, with two different color blue sub-pixels. The deep blue sub-pixel shared amongst a plurality of pixels. In some embodiments, the light blue unpatterned OLED may be in a stacked arrangement, and may include both phosphorescent and fluorescent emissive layers. Photoemissive quantum dots may be used to downconvert light blue emitted by the light blue unpatterned OLED to green and/or red to form green and/or red sub-pixels. A full color display based on light emission from one OLED emissive stack that provides Rec2020 color gamut. The full color display may include pixels that may have red, green, yellow, light blue, and deep blue sub-pixels. Some embodiments may include fluorescent and phosphorescent emitters or a TADF emitter in a stacked arrangement or in a tandem blue OLED.

Figure 6:
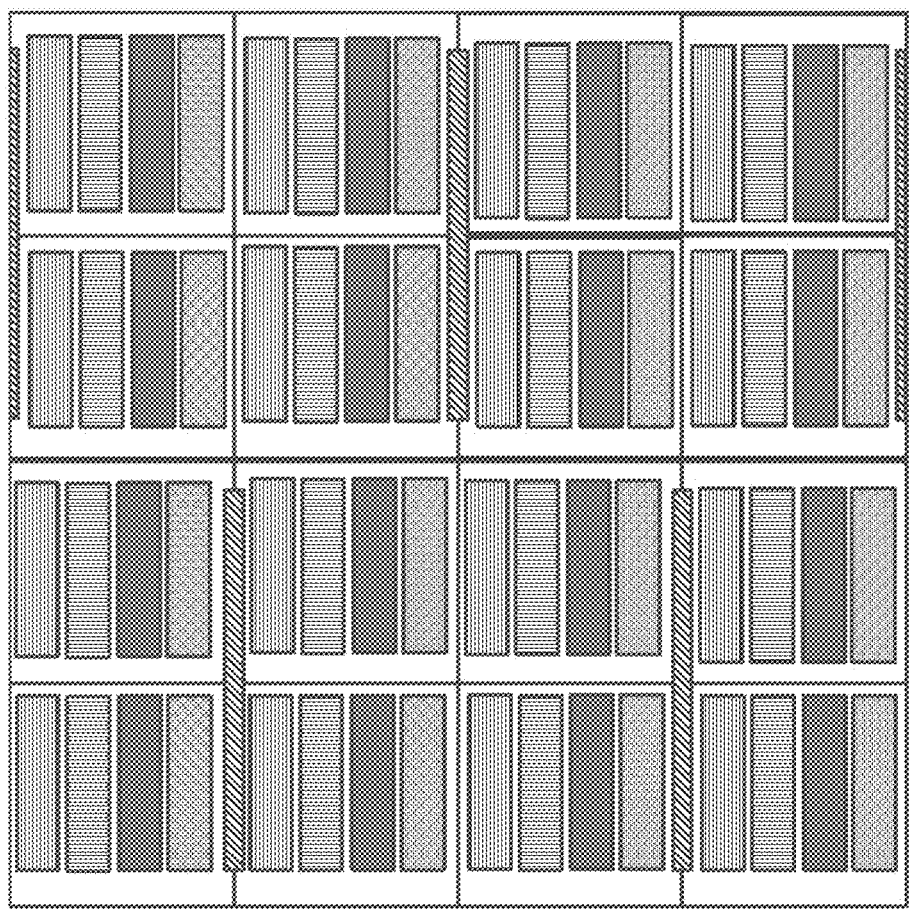
FIG. 6 shows an example of a pixel layout showing an unpatterned warm white OLED with warm white, deep blue, light blue, red, and green sub-pixels provided by filtering, cavity design, or downconversion, where each deep blue sub-pixel is shared by at least one other pixel according to embodiments of the disclosed subject matter.

In some embodiments of the disclosed subject matter, a high efficiency OLED display may be formed using an unpatterned OLED deposition. Instead of a conventional OLED display utilizing a cool white (e.g., D65) unpatterned OLED which relies on low efficiency fluorescent blue as a component to make white, embodiments of the disclosed subject matter may use a warm white OLED deposition (e.g., D30) such that phosphorescent light blue may be used in a white stack, instead of deep fluorescent blue. This arrangement may produce the warmer white color. A deep blue sub-pixel may be added using the techniques described above, where the deep blue sub-pixel may be used to produce a D65 white point. As shown in FIG. 6, this arrangement may produce a display having five colors in each pixel, including warm white, light blue, deep blue, green, and red, with 4.25 sub-pixels per pixel.

FIG. 6 shows an example of a pixel layout having an unpatterned warm white OLED with deep blue, light blue, red, and green sub-pixels enabled by filtering, cavity design, or downconversion, where each deep blue sub-pixel may be shared by at least one other pixel. A sub-pixel arrangement may be for a display using a warm white OLED deposition that enables the RGB1B2 architecture having one light blue and one deep blue sub-pixel. As shown in FIG. 6, one dark blue sub-pixel may be used for every four pixels. This is merely an example, and the one dark sub-pixel may be used with at least one other pixel. This arrangement may reduce the number of TFT circuits and data lines to 4.25 per pixel.

In the embodiments described above in connection with FIGS. 3-6, a full-color pixel arrangement for a device may be provided, the full-color pixel arrangement including a plurality of sub-pixels, each having an emissive region of a first color, where the full-color pixel arrangement comprises emissive regions having exactly one emissive color that is a red-shifted color of a deep blue sub-pixel of the plurality of sub-pixels. The exactly one emissive color may be light blue having a peak wavelength which may be greater than or equal to 460 nm, greater than or equal to 465 nm, or greater than or equal to 470 nm. In some embodiments, the exactly one emissive color may be light blue having 1931 CIE coordinates with CIEy that is greater than or equal to 0.20, greater than or equal to 0.15, or greater than or equal to 0.10. The exactly one emissive color may be formed by a phosphorescent light blue emitter. The exactly one emissive color may be formed by a TADF emitter and/or phosphor sensitized fluorescence.

The plurality of sub-pixels of the full-color pixel arrangement may include a light blue sub-pixel, the deep blue sub-pixel, a red sub-pixel, and a green sub-pixel. The deep blue sub-pixel may be formed by applying a color change medium to the light-blue sub-pixel, and has a resultant color range of 1931 CIE coordinates with CIE y of less than 0.10. The deep blue sub-pixel may be disposed in a microcavity to blue shift an output of the emissive region.

The red light from the red sub-pixel and green light from the green sub-pixel may be generated by down-converting light emitted from the emissive color of the emissive regions by photoemissive quantum dots that are part of the red sub-pixel and the green sub-pixel. At least one of the red sub-pixels and the green sub-pixels uses a color filter to refine a spectrum of at least one of the red light emitted from the red subpixel and the green light emitted from the green sub-pixel. At least one of the light blue sub-pixel and the deep blue sub-pixel may be formed in a cavity structure and/or may be formed using a non-cavity structure.

The emissive regions of the device having exactly one emissive color may be a single emissive layer including one emitter, a single emissive layer having a plurality of emitters, or a stacked emissive layer device. Each emissive layer of the stacked emissive layer device may have the same type of emitters, a combination of types of emitters, or different types of emitters. The emissive layers in the stacked emissive layer device include a light blue phosphorescent emitter and a deep blue fluorescent emitter. In some implementations, the emissive layers in the stacked emissive layer device include a light blue phosphorescent emitter and a green phosphorescent emitter.

The pixel arrangement of the device may include a yellow sub-pixel. In some embodiments, the full-color pixel arrangement of the device may include a white sub-pixel. The emissive regions having exactly one emissive color may be phosphorescent, and are used to generate light emitted by the white sub-pixel. The deep blue sub-pixel of the pixel arrangement may be shared by a plurality of pixels. For example, the deep blue-sub-pixel may be shared by 2 pixels, 4 pixels, or the like.

Is some embodiments, the full-color pixel arrangement of the device may provide a Rec2020 color gamut. The device having the full-color pixel arrangement may be an electroluminescent quantum dot device.

According to an embodiment of the disclosed subject matter, a full-color pixel arrangement for a device may be provided, the full-color pixel arrangement may include a plurality of sub-pixels, each having an emissive region of a first color, where the full-color pixel arrangement comprises emissive regions having exactly one emissive color, and where the plurality of sub-pixels comprise a light blue sub-pixel, a deep blue sub-pixel, a red sub-pixel, and a green sub-pixel.

The exactly one emissive color may be light blue having a peak wavelength that may be greater than or equal to 460 nm, greater than or equal to 465 nm, and greater than or equal to 470 nm. In some embodiments, the exactly one emissive color may be light blue having 1931 CIE coordinates with CIEy greater than or equal to 0.20, greater than or equal to 0.15, or greater than or equal to 0.10. The exactly one emissive color is formed by a phosphorescent light blue emitter. In some embodiments, the exactly one emissive color can be formed by a TADF emitter and/or phosphor sensitized fluorescence.

The deep blue sub-pixel of the full-color pixel arrangement may be formed by applying a color change medium to the light-blue sub-pixel, and may have a resultant color range of 1931 CIE coordinates with CIE y of less than 0.10. The deep blue sub-pixel may be disposed in a microcavity to blue shift an output of the emissive region.

Red light from the red sub-pixel and green light from the green sub-pixel may be generated by down-converting light emitted from the emissive color of the emissive regions by photoemissive quantum dots that are part of the red sub-pixel and the green sub-pixel. At least one of the red sub-pixels and the green sub-pixels uses a color filter to refine a spectrum of at least one of the red light emitted from the red subpixel and the green light emitted from the green sub-pixel.

At least one of the light blue sub-pixel and the deep blue sub-pixel may be formed in a cavity structure. At least one of the light blue sub-pixel and the deep blue sub-pixel may be formed using a non-cavity structure.

The emissive regions of the device having exactly one emissive color may be a single emissive layer including one emitter, a single emissive layer having a plurality of emitters, or a stacked emissive layer device. Each layer of the stacked emissive layer device may have the same type of emitters, may have a combination of types of emitters, or may have different types of emitters. The emissive layers in the stacked emissive layer device may include a light blue phosphorescent emitter and a deep blue fluorescent emitter. The emissive layers in the stacked emissive layer device may include a light blue phosphorescent emitter and a green phosphorescent emitter. The pixel arrangement may include a yellow sub-pixel.

The pixel arrangement of the device may include a white sub-pixel. In some embodiments, the emissive regions having exactly one emissive color may be phosphorescent, and may be used to generate light emitted by the white sub-pixel. The deep blue sub-pixel of the pixel arrangement may be shared by a plurality of pixels.

The pixel arrangement may provide a Rec2020 color gamut. The device may be an electroluminescent quantum dot device.

In an embodiment of the disclosed subject matter, a full-color pixel arrangement for an OLED device may be provided, the full-color pixel arrangement including a plurality of sub-pixels, each having an emissive region of a first color, where the full-color pixel arrangement comprises emissive regions having exactly two emissive colors. The exact two emissive colors may be light blue and deep blue. The emissive regions may be a phosphorescent emissive layer, a fluorescent emissive layer, or a thermally activated delayed fluorescent (TADF) layer.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A full-color pixel arrangement for a device, the full-color pixel arrangement comprising:
    a plurality of sub-pixels, each having an emissive region of a first color;
    wherein the full-color pixel arrangement comprises emissive regions having exactly one emissive color that is a red-shifted color of a deep blue sub-pixel of the plurality of subpixels, and wherein the exactly one emissive color has 1931 CIE coordinates with a CIEy value greater than 0.15.

2. The full-color pixel arrangement of claim 1, wherein the exactly one emissive color is light blue.

3. The full-color pixel arrangement of claim 2, wherein the deep blue sub-pixel is formed by applying a color change medium to the light-blue emissive region, and has a resultant color range in 1931 CIE coordinates with CIE y of less than 0.1.

4. The full-color pixel arrangement of claim 2, wherein the plurality of sub-pixels comprise:
    the deep blue sub-pixel, a red sub-pixel, and a green sub-pixel.

5. The full-color pixel arrangement of claim 1, wherein the plurality of sub-pixels comprise:
    the deep blue sub-pixel, a red sub-pixel, and a green sub-pixel.

6. The full-color pixel arrangement of claim 5, wherein red light from the red sub-pixel and green light from the green sub-pixel are at least partially generated by down-converting light emitted from the emissive color of the emissive regions by photoemissive quantum dots that are part of the red sub-pixel and the green sub-pixel.

7. The full-color pixel arrangement of claim 5, wherein red light from the red sub-pixel is at least partially generated by down-converting light emitted from the emissive color of the emissive regions by photoemissive quantum dots that are part of the red sub-pixel.

8. The full-color pixel arrangement of claim 5, wherein the deep blue sub-pixel of the pixel arrangement is shared by a plurality of pixels.

9. The full-color pixel arrangement of claim 5, wherein at least one of the red sub-pixel and the green sub-pixel uses a color filter to refine a spectrum of at least one of the red light emitted from the red subpixel and the green light emitted from the green sub-pixel.

10. The full-color pixel arrangement of claim 1, wherein the deep blue sub-pixel is disposed in a microcavity to blue shift an output of the emissive region.

11. The full-color pixel arrangement of claim 1, wherein the emissive regions having exactly one emissive color are selected from the group consisting of: a single emissive layer including one emitter, a single emissive layer having a plurality of emitters, and a stacked emissive layer device.

12. The full-color pixel arrangement of claim 11, wherein each emissive layer of the stacked emissive layer device has the same type of emitters, a combination of types of emitters, or different types of emitters.

13. The full-color pixel arrangement of claim 12, wherein the emissive regions having exactly one emissive color comprise the single emissive layer having a plurality of emitters or the stacked emissive layer device, and include a blue fluorescent emitter and a green phosphorescent emitter.

14. The full-color pixel arrangement of claim 11, wherein the emissive regions having exactly one emissive color comprise the single emissive layer having a plurality of emitters or the stacked emissive layer device, and include a blue phosphorescent emitter and a green phosphorescent emitter.

15. The full-color pixel arrangement of claim 11, wherein the emissive regions having exactly one emissive color comprise the single emissive layer having a plurality of emitters or the stacked emissive layer device, and include a blue emitter and a green emitter, any of which exhibits phosphorescence, fluorescence, hyperfluorescence or phosphor sensitized fluorescence.

16. The full-color pixel arrangement of claim 11, wherein the emissive regions having exactly one emissive color comprise the single emissive layer having a plurality of emitters or the stacked emissive layer device, and include a blue phosphorescent emitter and a blue fluorescent emitter.

17. The full-color pixel arrangement of claim 1, wherein the emissive regions having exactly one emissive color are selected from the group consisting of: a single emissive layer having a plurality of green and blue emitters, and a stacked emissive layer device having a plurality of green and blue emitters.

18. The full-color pixel arrangement of claim 17, wherein the device is an electroluminescent quantum dot device or a TADF device.

19. The full-color pixel arrangement of claim 1, wherein the emissive regions having exactly one emissive color comprise at least one layer selected from the group consisting of: a phosphorescent emissive layer, a fluorescent emissive layer, a fluorescent emissive layer exhibiting hyperfluorescence or phosphor sensitized fluorescence, a phosphor sensitized fluorescent emissive layer, and a thermally activated delayed fluorescent (TADF) layer, and a TADF layer exhibiting hyperfluorescence or phosphor sensitized fluorescence.

20. The full-color pixel arrangement of claim 1, wherein the device comprises a consumer product selected from the group consisting of: a flat panel display, a computer monitor, a medical monitor, a television, a billboard, a light for interior or exterior illumination and/or signaling, a heads-up display, a fully or partially transparent display, a flexible display, a laser printer, a telephone, a mobile phone, a tablet, a phablet, a personal digital assistant (PDA), a wearable device, a laptop computer, a digital camera, a camcorder, a viewfinder, a microdisplay less than 2 inches in diagonal, a 3-D display, a virtual reality or augmented reality display, a vehicle, a video wall comprising multiple displays tiled together, a theater or stadium screen, and a sign.

21. The full-color pixel arrangement of claim 1, wherein the plurality of sub-pixels comprises four sub-pixels.

22. The full-color pixel arrangement of claim 21, wherein a first sub-pixel of the four sub-pixels comprises an emissive region of the exactly one emissive color, at least a first portion of which is unfiltered.

23. The full-color pixel arrangement of claim 22, further comprising a down-conversion medium disposed in a stack with a second portion of the emissive region separate from the first portion.

24. The full-color pixel arrangement of claim 23, wherein the down-conversion medium comprises a quantum dot.

25. The full-color pixel arrangement of claim 23, wherein a second, third, and fourth sub-pixel of the four sub-pixels comprise a red sub-pixel, a green sub-pixel, and a blue sub-pixel, respectively.

\* \* \* \* \*